United States Patent
Lin et al.

(10) Patent No.: US 10,461,206 B2
(45) Date of Patent: Oct. 29, 2019

(54) SOLAR PHOTOVOLTAIC-THERMAL SYSTEM

(71) Applicant: Changzhou Almaden Co., Ltd., Changzhou (CN)

(72) Inventors: Jinxi Lin, Changzhou (CN); Jinhan Lin, Changzhou (CN); Yuting Lin, Wufeng Township (TW)

(73) Assignee: Changzhou Almaden Co., Ltd., Changzhou (CN)

( * ) Notice: Subject to any disclaimer, the term of this patent is extended or adjusted under 35 U.S.C. 154(b) by 0 days.

(21) Appl. No.: 13/871,236

(22) Filed: Apr. 26, 2013

(65) Prior Publication Data
US 2013/0284237 A1    Oct. 31, 2013

(30) Foreign Application Priority Data
Apr. 26, 2012  (CN) .......................... 2012 1 0127145

(51) Int. Cl.
*H01L 31/054* (2014.01)
*H01L 31/048* (2014.01)
*H02S 40/44* (2014.01)

(52) U.S. Cl.
CPC ...... *H01L 31/0547* (2014.12); *H01L 31/0488* (2013.01); *H02S 40/44* (2014.12); *Y02E 10/52* (2013.01); *Y02E 10/60* (2013.01)

(58) Field of Classification Search
CPC ............ H01L 31/0547; H01L 31/0488; H01L 31/058; H02S 40/44; Y02E 10/52; Y02E 10/60
USPC .................................................. 136/242–265
See application file for complete search history.

(56) References Cited

U.S. PATENT DOCUMENTS

| | | | | |
|---|---|---|---|---|
| 4,395,582 A * | 7/1983 | Damsker | | 136/248 |
| 4,411,490 A * | 10/1983 | Daniel | | 126/648 |
| 6,057,504 A * | 5/2000 | Izumi | | F03G 6/001 136/246 |
| 7,595,543 B2 * | 9/2009 | Weber | | H01L 31/068 136/258 |
| 2005/0250639 A1* | 11/2005 | Siebers et al. | | 501/68 |
| 2009/0067784 A1* | 3/2009 | Ghosh | | F24J 2/06 385/33 |
| 2009/0148688 A1* | 6/2009 | Sasaki | | C09D 183/04 428/315.9 |
| 2009/0178708 A1* | 7/2009 | Higashiyama et al. | | 136/256 |
| 2009/0199893 A1* | 8/2009 | Bita | | H01L 31/0543 136/248 |
| 2010/0326520 A1* | 12/2010 | Tsai | | 136/258 |
| 2011/0186109 A1* | 8/2011 | Elazari | | H02S 40/44 136/248 |
| 2011/0232724 A1* | 9/2011 | Duong | | F24J 2/0444 136/248 |
| 2012/0000508 A1* | 1/2012 | Yip | | H01L 31/048 136/246 |
| 2012/0060898 A1* | 3/2012 | Ahlgren | | H01L 31/042 136/248 |
| 2012/0160302 A1* | 6/2012 | Citron | | H01L 31/0547 136/248 |

(Continued)

*Primary Examiner* — Magali P Slawski
*Assistant Examiner* — Kourtney R S Carlson
(74) *Attorney, Agent, or Firm* — Drinker Biddle & Reath LLP

(57) ABSTRACT

The present invention discloses a solar photovoltaic-thermal system, combined with a solar heat collection assembly and a solar cell assembly, so that solar energy utilization is more efficient.

12 Claims, 3 Drawing Sheets

(56) References Cited

U.S. PATENT DOCUMENTS

2013/0008500 A1 1/2013 Lin et al.
2013/0233383 A1* 9/2013 Naumovitz et al. .......... 136/259

* cited by examiner

SOLAR PHOTOVOLTAIC-THERMAL SYSTEM

BACKGROUND OF THE INVENTION

1. Field of the Invention

The present invention relates to a solar photovoltaic-thermal system, and more particularly to an integrated system having a solar heat collection assembly with a light collection cavity and having a double-glass solar cell component.

2. Description of the Related Art

Solar energy is the most prevalently used environmentally friendly source of energy. Generally, there are two principal manners by which solar energy is utilized. In the first manner, a solar heat collector directly absorbs radiant heat from sunlight, and in the second manner, solar energy is converted into electric energy by utilizing the photovoltaic effect of a solar cell.

Solar heat collectors are most commonly employed in solar heaters, which are generally operated by guiding sunlight to a water pipe through a condensing reflecting plate or a vacuum heat collector, so that optical energy from sunlight is converted into heat energy to heat water in the pipe.

The solar cell assembly is generally formed by combining a multilayered structure of glass, ethylene vinyl acetate (EVA), a photovoltaic component and a solar energy back sheet, and peripheral components such as an outer frame made of aluminum, galvanized steel sheet, wood and synthetic materials (such as polyethylene (PE), polypropylene (PP) and ethylene propylene rubber), a junction box, lead wires, and a battery. Under sunlight irradiation, the solar cell assembly outputs a certain working voltage and working current through photovoltaic effect. However, efficiency of the solar cell assembly is limited, and a large part of solar energy is converted into heat energy and accumulated in a solar energy component, which results in increased temperature of the solar energy component and causes damage to the solar cell assembly and decrease in the total output power. If the solar cell assembly and the solar heat collector can be integrated to form a solar photovoltaic-thermal system, not only can solar energy be utilized more effectively, but also the heat energy accumulated by the solar energy component can be effectively reduced, thereby avoiding the aforementioned problems. Moreover, integration of the solar cell assembly and the solar heat collector to form a solar photovoltaic-thermal system may also reduce the amount of materials required, which would be economically beneficial.

The present invention provides a highly efficient and reliable solar photovoltaic-thermal system.

SUMMARY OF THE INVENTION

The objective of the present invention is to provide a solar photovoltaic-thermal system comprising:

a solar cell assembly comprising a transparent glass front cover, a transparent encapsulating material, a transparent glass back sheet and photovoltaic components encapsulated by the transparent encapsulating material, wherein a gap allowing light penetration is provided between adjacent photovoltaic components;

a plurality of light guides disposed below the transparent glass back sheet of the solar cell assembly;

a light reflecting plate disposed below the solar cell assembly and the light guide, wherein the light reflecting plate, the two adjacent light guides and the transparent glass back sheet form a light collection cavity; and a heat exchanger disposed in the light collection cavity.

BRIEF DESCRIPTION OF THE DRAWINGS

The invention will be described according to the appended drawings, in which.

PREFERRED EMBODIMENT OF THE PRESENT INVENTION

Figure 1:
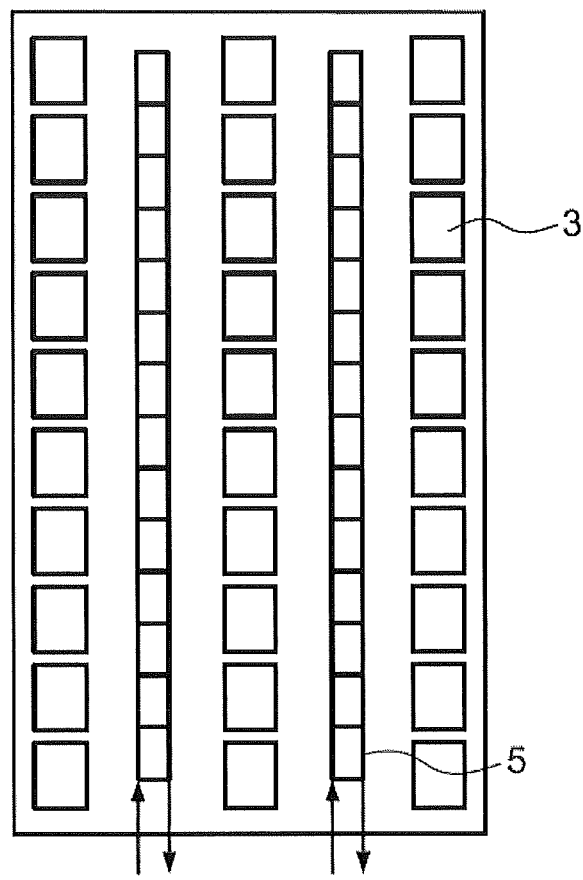
FIG. 1 is a schematic top view of a solar photovoltaic-thermal system of the present invention, where 3 is a photovoltaic component, 5 is a heat exchanger, and the arrow indicates the flow direction of the working fluid.

In this context, unless otherwise limited, a singular term (such as "a") also includes a plural form thereof. In this context, all embodiments and exemplary terms (for example, "such as") only aim at making the present invention more prominent, but are not intended to limit the scope of the present invention; terms in this specification should not be construed as implying that any component not claimed may form a necessary component for implementing the present invention.

The objective of the present invention is to provide a solar photovoltaic-thermal system comprising:

a solar cell assembly comprising a transparent glass front cover, a transparent encapsulating material, a transparent glass back sheet and photovoltaic components encapsulated by the transparent encapsulating material, wherein a gap allowing light penetration is provided between adjacent photovoltaic components;

a plurality of light guides disposed below the transparent glass back sheet of the solar cell assembly;

a light reflecting plate disposed below the solar cell assembly and the light guide, wherein the light reflecting plate, the two adjacent light guides and the transparent glass back sheet form a light collection cavity; and a heat exchanger disposed in the light collection cavity.

Parts and technical features of the solar photovoltaic-thermal system of the present invention are further illustrated below.

Solar Cell Assembly

The solar cell assembly of the present invention may be any type of solar cell assembly. In addition to the front cover, the encapsulating material, the photovoltaic component, and the back sheet, the solar cell assembly of the present invention may include peripheral components such as an outer frame, an injunction box, lead wires, and a battery. All the peripheral components may be manufactured by means of conventional technology, and therefore are not described in any further detail in the present invention.

No special limitation is imposed on the front cover used in the solar cell assembly of the present invention; generally, a low reflective transparent glass plate is used, so as to provide sufficient light transmissive property and mechanical strength, such as compressive strength, tensile strength and hardness, and prevent moisture from entering the solar cell assembly.

The encapsulating material used in the solar cell assembly of the present invention is mainly for fixing the photovoltaic component of the solar cell and providing physical protection to the photovoltaic component, such as resisting shock and preventing moisture from entering. The encapsulating layer in the solar cell assembly of the present invention may be made of any conventional material; currently, EVA is the most extensively used encapsulating material for a solar cell plate. EVA is a thermosetting resin, has properties such as high light transmission, heat resistance, low-temperature resistance, moisture resistance, and weather proofing after curing, has good adherence with metal, glass and plastic, and also has certain elasticity, shock resistance and heat conductivity, and therefore is an ideal solar cell encapsulating material.

No particular limitation is imposed on the photovoltaic component in the solar cell assembly of the present invention, which may be selected from various forms of photovoltaic components, such as a crystalline silicon photovoltaic component, a thin-film photovoltaic component, and a dye light-sensitive photovoltaic component.

In the solar photovoltaic-thermal system of the present invention, at least one part of the irradiation area should not be covered by the photovoltaic component, so that light can penetrate the layer of the solar cell assembly and reach the light collection cavity at the bottom thereof, so as to heat the fluid in the heat exchanger. The proportion left uncovered may be adjusted to accommodate particular conditions of its implementation, such as the conversion efficiency of the photovoltaic component, duration and intensity of sunlight, and the demand for electric power relative to that for thermal power. Generally, it would be appropriate that the amount covered is from 30% to 80%, preferably from 40% to 60%. In a specific embodiment, the solar photovoltaic-thermal system of the present invention has the configuration of the solar cell assembly and the heat exchanger as shown in FIG. 1.

In a specific embodiment of the present invention, the photovoltaic component in the solar cell assembly may be a double-facial photovoltaic component, such as HIT Double® of SANYO Corporation, Japan, which can fully utilize the optical energy reflected by the light collection cavity back to the photovoltaic component.

The back sheet in the solar cell assembly of the present invention simultaneously serves as the top cover of the light collection cavity, and therefore needs to have special properties. Firstly, the back sheet has to be transparent, so that light can enter the light collection cavity. Secondly, the back sheet is supported only by the outer frame and the light guide, leaving a large portion thereof suspended in the air, and therefore has to have excellent mechanical properties. Generally, an appropriate back sheet material should have compressive strength of at least about 120 MPa, bending strength of at least about 120 MPa and tensile strength of at least about 90 MPa.

A novel type of physical tempered glass, which may be made through treatment procedures such as aerodynamic heating and cooling, may be used as the back sheet glass of the present invention. Specifically, this physical tempered glass may be made by performing heating in a aerodynamic-heating tempering furnace (such as a flatbed tempering furnace produced by LiSEC corporation) at a temperature ranging from about 600° C. to about 750° C., preferably from 630° C. to about 700° C., and then performing rapid cooling through, for example, an air nozzle. In this context, the term "aerodynamic heating" refers to a process of transferring heat to an object through high-temperature gas generated when the object and air or other gases move at a high relative velocity. When the tempered glass is heated in the aerodynamic heating manner, the glass and the tempering furnace do not directly contact, so the glass is not deformed, and is suitable for thin glass. For a more detailed physical tempered glass preparation method, reference may be made to the content in the application of Chinese Patent Application No. 201110198526.1 (also US Patent Publication No. 2013/0008500 A1).

The solar back sheet of most conventional solar cells is made of polyvinyl fluoride (such as Tedlar® of DuPont Corporation, US). Such material does not have the requisite mechanical properties as described above, and therefore is not applicable to the present invention.

Normal glass does not have the requisite mechanical properties, either (for example, normal glass only has a tensile strength of about 40 MPa), and thus cannot be applied to the present invention. Moreover, a conventional physically tempered glass might have sufficient mechanical properties, but must normally be over 3 millimeters thick to avoid deformation, which makes it heavy, and thus not only imposes an increased load on the light guide but also makes it unsuitable for mounting on the roof of a residential building. As for conventional chemically tempered glass, it might meet the requisite mechanical properties and is not subject to the limitations imposed on thickness by machining. However, chemically tempered glass degrades very easily due to environmental factors, and has certain other disadvantages that limit its range of application, such as being difficult to coat, stripping easily and being costly.

Solar Heat Collection Assembly

The solar heat collection assembly of the present invention is formed of a light collection cavity enclosed by the back sheet of a solar cell assembly, a light guide, and a light reflecting plate, and a heat exchanger therein.

The main aim of the light collection cavity lies in that: the incident sunlight that enters is confined in the light collection cavity, and optical energy is converted into radiant heat through mechanisms such as scattering and reflecting so that the radiant heat is concentrated on the heat exchanger and heats the fluid therein. In addition, because the temperature of the light collection cavity is higher than the temperature of the fluid in the heat exchanger, a part of the heat energy is transferred to the fluid through conduction.

The light guide and the bottom-most light reflecting plate in the solar heat collection assembly of the present invention may be made of various materials, such as glass or plastic. The plastic material may be formed of one or more polymeric resin layers. The type of resin used for forming the polymeric resin layer is not particularly limited, and can be, for example, but not limited to, polyester resin, such as polyethylene terephthalate (PET) or polyethylene naphthalate (PEN); polyacrylate resin, such as polymethylmethacrylate (PMMA); polyolefin resin, such as polyethylene (PE) or polypropylene (PP); polystyrene resin; polycycloolefin resin; polyimide resin; polycarbonate resin; polyurethane resin; triacetate cellulose (TAC); polylactic acid; or a mixture thereof, and preferably is PET, PMMA, polycycloolefin resin, TAC, polylactic acid or a mixture thereof.

The surface shape of the light guide in the present invention is not particularly limited. However, its main purpose is to reflect the incident light onto the heat exchanger as much as possible, so it preferably has a plane with a slant angle (such as a side of a triangle), an arc surface or a parabolic surface.

In order to increase heat collection efficiency of the light collection cavity, a surface of the light guide and a surface of the light reflecting plate may be covered with a reflecting layer. The primary function of the reflecting layer on the light guide and the light reflecting plate is to reflect full-waveband light, so the type of material employed is not particularly limited and preferably may be metal, such as silver, gold, aluminum or chromium; and a metal oxide or a non-metal material. Materials such as $TiO_2$, $BaSO_4$, and Teflon have a white appearance, and therefore may provide more effective reflection of light, and are thus preferable materials. The reflecting layer may be bonded to the light guide or the light reflecting plate by means of any suitable method; for example, they can be bonded by using an adhesive. When the reflecting layer is made of a metal material while the light guide or the light reflecting plate is made of a glass material, a preferable method is to directly deposit a metal on a glass substrate by utilizing methods such as physical vapor deposition. This method does not need any adhesive, so in addition to reducing manufacturing process steps, it avoids problems associated with deterioration of the adhesive. Such method is preferable in view of reliability.

Alternatively, the light guide may be made of metals.

Likewise, in order to improve effectiveness of the light collection cavity, the back of the back sheet of the solar cell assembly may be covered with a reflecting layer. However, in order to allow sunlight to enter the light collection cavity, the reflecting layer on the back of the back sheet has to be capable of selectively reflecting light. Further, the incident sunlight is to mainly short waveband, while the light reflected after irradiating the object is converted into long-waveband light, so the back of the back sheet of the solar cell assembly of the present invention is mostly preferably covered with a reflecting layer that mainly reflects long-waveband light.

Generally, the long-waveband light reflecting layer is a multilayered structure formed primarily of a metal film and a transparent metal oxide film, and may employ any of the following types of design:

(1) highly reflective metal film layer/transparent metal oxide film layer/highly reflective metal film layer;

(2) highly reflective metal film layer/transparent metal oxide film layer (A)/transparent metal oxide film layer (B)/transparent metal oxide film layer (A)/highly reflective metal film layer, where the optical refractive index of the transparent metal oxide film layer A is greater than the optical refractive index of the transparent metal oxide film layer B; and (3) repetitive alternating multilayered structure of different transparent metal oxide film layers.

Figure 3:
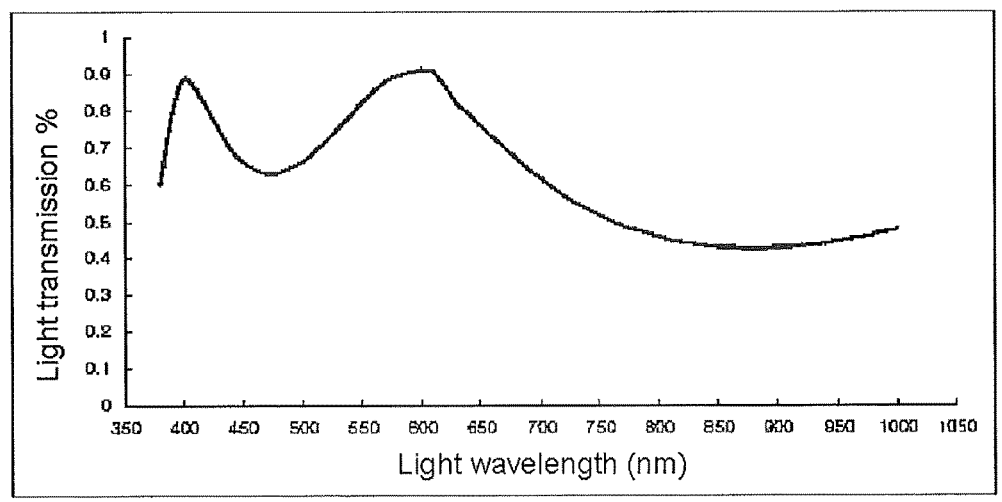
FIG. 3 to FIG. 5 show light wavelength and transmission data of different examples of a long-waveband light reflecting layer in the present invention, wherein the selected long-waveband light reflecting layers are respectively a multilayered structure of silver film/gallium zinc oxide (GZO) film/silver film (FIG. 3), a multilayered structure of silver film/GZO film/aluminum zinc oxide (AZO) film/GZO film/silver film (FIG. 4), and an alternating-layered structure of GZO and AZO (GZO/AZO/GZO/AZO/GZO/AZO/GZO/AZO/GZO/AZO/GZO) (FIG. 5).
Figure 4:
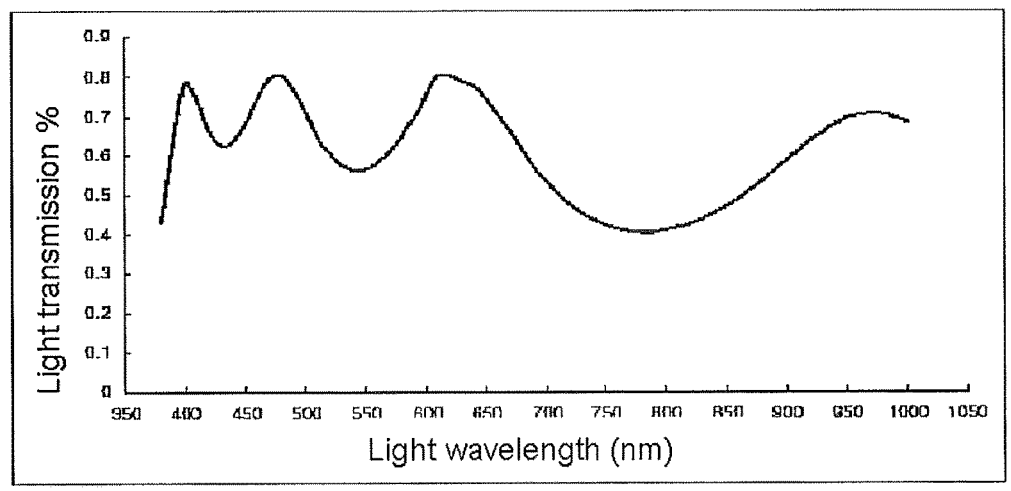
Figure 5:
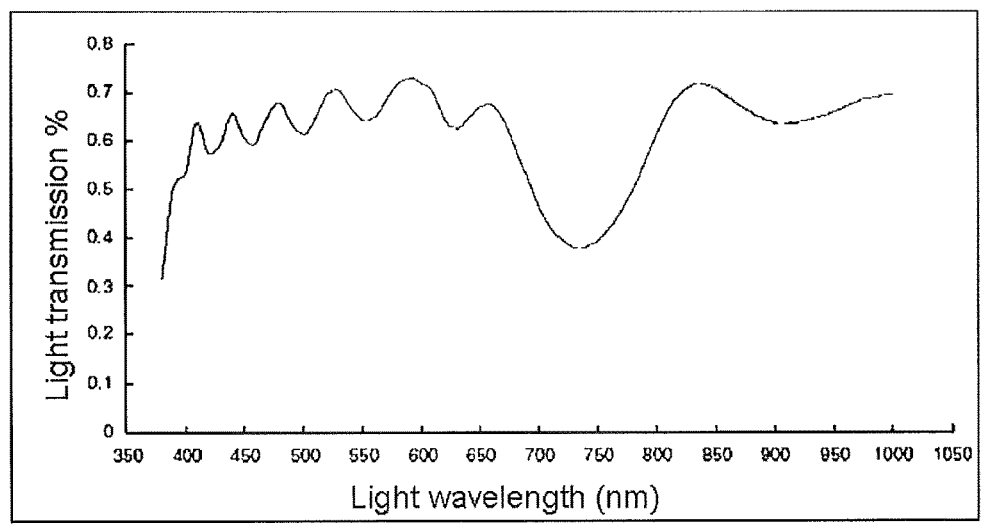

Suitable highly reflective metal includes, for example, silver, gold, aluminum or chromium, and preferably silver. The suitable transparent metal oxide includes, for example, an indium tin oxide (ITO), an indium oxide plus titanium oxide (ITiO), an indium molybdenum oxide (IMO), a zinc oxide (ZnO), an indium gallium zinc oxide (IGZO), an AZO, a GZO, and an indium zinc oxide (IZO), and preferably GZO and AZO. As a specific example (1), the long-waveband light reflecting layer is a multilayered structure of silver film/GZO film/silver film and the light transmission-wavelength data thereof are as shown in FIG. 3; as a specific example (2), the long-waveband light reflecting layer is a multilayered structure of silver film/GZO (n=2.1) film/AZO (n=1.9) film/GZO (n=2.1) film/silver film, and the light transmission-wavelength data thereof are as shown in FIG. 4. As a specific example (3), the long-waveband light reflecting layer is an alternating multilayered structure (GZO/AZO/GZO/AZO/GZO/AZO/GZO/AZO/GZO/AZO/GZO) of GZO and AZO, and the light transmission-wavelength data thereof are as shown in FIG. 5.

In each light collection cavity, at least one heat exchanger should be provided to remove the heat energy in the cavity. The material of the heat exchanger used in the present invention has no special limitation, and may be made of a heat conducting material such as copper or stainless steel. The type of heat exchanger also has no limitation; for example, a column tube heat exchanger or a spiral-tube heat exchanger may be used. The heat exchanger may be coated or covered with a dark heat absorbing material, so as to increase heat transfer efficiency.

The fluid in the heat exchanger may be any suitable fluid, preferably one with a high specific heat, such as water. However, a gas is also possible.

Figure 2:
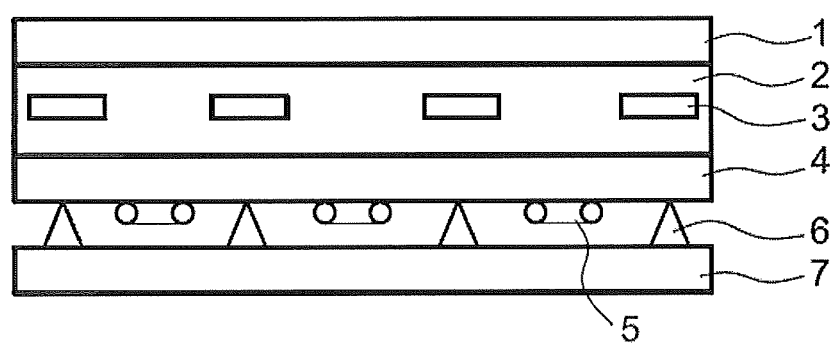
FIG. 2 is a schematic cross-sectional view of the solar photovoltaic-thermal system of the present invention, where 1 is a transparent glass front cover, 2 is a transparent encapsulating material, 3 is a photovoltaic component, 4 is a transparent glass back sheet, 5 is a heat exchanger, 6 is a light guide and 7 is a light reflecting plate, and the space enclosed by 6 and 7 forms a light collection cavity.

In a specific embodiment, the solar photovoltaic-thermal system of the present invention may have the cross-section configuration as shown in FIG. 2.

What is claimed is:

1. A solar photovoltaic-thermal system comprising:
  a solar cell assembly comprising a transparent glass front cover, a transparent encapsulating material, a transparent glass back sheet and a photovoltaic component situated between the transparent glass front cover and the transparent glass back sheet and encapsulated by the transparent encapsulating material;
  a plurality of light guides, located below the transparent glass back sheet of the solar cell assembly and each having a plane with a slant angle with respect to the transparent glass back sheet, an arc surface or a parabolic surface; and
  a light reflecting plate disposed below the solar cell assembly and the light guides, wherein the light reflecting plate, two adjacent light guides and the transparent glass back sheet form a fully enclosed space and confine a light collection cavity;
  a heat exchanger disposed in the light collection cavity; and
  an outer frame;
  wherein the transparent glass back sheet is supported only by the outer frame and the light guides, and
  wherein the heat exchanger is not vertically shaded by the photovoltaic component, and the heat exchanger is heated by radiation heat and conduction heat from the light collection cavity.

2. The solar photovoltaic-thermal system according to claim 1, wherein the transparent glass back sheet is physical tempered glass.

3. The solar photovoltaic-thermal system according to claim 2, wherein the physical tempered glass has compressive strength ranging from about 120 MPa to about 300 MPa, bending strength ranging from about 120 MPa to about 300 MPa and tensile strength ranging from about 90 MPa to about 180 MPa.

4. The solar photovoltaic-thermal system according to claim 1, wherein the surface of the transparent glass back sheet facing the light collection cavity is covered with a long-waveband light reflecting layer.

5. The solar photovoltaic-thermal system according to claim 4, wherein the long-waveband light reflecting layer is a multilayered structure of highly reflective metal film/transparent metal oxide film/highly reflective metal film.

6. The solar photovoltaic-thermal system according to claim 5, wherein the highly reflective metal film is a silver film, and the transparent metal oxide film is a zinc oxide film.

7. The solar photovoltaic-thermal system according to claim 4, wherein the long-waveband light reflecting layer is a multilayered structure of highly reflective metal film/transparent metal oxide film (A)/transparent metal oxide film (B)/transparent metal oxide film (A)/highly reflective metal film, and wherein the optical refractive index of the transparent metal oxide film (A) is greater than the optical refractive index of the transparent metal oxide film (B).

8. The solar photovoltaic-thermal system according to claim 7, wherein the highly reflective metal film of the long-waveband light reflecting layer is silver, the transparent metal oxide film (A) is a gallium zinc oxide (GZO) film, and the transparent metal oxide film (B) is an aluminum zinc oxide (AZO) film.

9. The solar photovoltaic-thermal system according to claim 4, wherein the long-waveband light reflecting layer is bonded to the transparent glass back sheet by direct deposition.

10. The solar photovoltaic-thermal system according to claim 1, wherein the light reflecting plate or the light guides or both are covered with a reflecting layer on the surfaces facing the light collection cavity.

11. The solar photovoltaic-thermal system according to claim 10, wherein the reflecting layer is a metal material selected from silver, gold, aluminum or chromium or a metal oxide or a non-metal material selected from $TiO_2$, $BaSO_4$ or Teflon.

12. A solar photovoltaic-thermal system comprising:
a solar cell assembly comprising a transparent glass front cover, a transparent encapsulating material, a transparent physical tempered glass back sheet made by aerodynamic heating and cooling, and a double-facial photovoltaic component situated between the transparent glass front cover and the transparent physical tempered glass back sheet and encapsulated by the transparent encapsulating material;
a plurality of light guides, located below the transparent glass back sheet of the solar cell assembly and each having a plane with a slant angle with respect to the transparent glass back sheet, an arc surface or a parabolic surface; and
a light reflecting plate disposed below the solar cell assembly and the light guides, wherein the light reflecting plate, two adjacent light guides and the transparent glass back sheet form a fully enclosed space and confine a light collection cavity;
a heat exchanger disposed in the light collection cavity; and
an outer frame,
wherein the transparent glass back sheet is supported only by the outer frame and the light guides, and
wherein the heat exchanger is not vertically shaded by the photovoltaic component, and the heat exchanger is heated by radiation heat and conduction heat from the light collection cavity.

* * * * *